United States Patent
Kim et al.

(10) Patent No.: US 6,884,945 B2
(45) Date of Patent: Apr. 26, 2005

(54) MULTI-LAYER PRINTED CIRCUIT BOARD AND A BGA SEMICONDUCTOR PACKAGE USING THE MULTI-LAYER PRINTED CIRCUIT BOARD

(75) Inventors: Dock-Heung Kim, Pyoungtaek (KR); Yong-Il Kim, Incheon (KR)

(73) Assignee: LG Electronics Inc., Seoul (KR)

( * ) Notice: Subject to any disclaimer, the term of this patent is extended or adjusted under 35 U.S.C. 154(b) by 60 days.

(21) Appl. No.: 10/384,658

(22) Filed: Mar. 11, 2003

(65) Prior Publication Data

US 2003/0168255 A1 Sep. 11, 2003

Related U.S. Application Data

(62) Division of application No. 09/832,193, filed on Apr. 11, 2001, now Pat. No. 6,580,036.

(30) Foreign Application Priority Data

Apr. 11, 2000 (KR) .......................................... 2000/19037
Apr. 11, 2000 (KR) .......................................... 2000/19040

(51) Int. Cl.[7] .......................... H01R 12/04; H05K 1/11
(52) U.S. Cl. ........................ 174/262; 174/264; 29/830; 29/832
(58) Field of Search ............................... 174/261–266; 29/830, 852; 361/792–795

(56) References Cited

U.S. PATENT DOCUMENTS

| | | | |
|---|---|---|---|
| 4,963,697 A | 10/1990 | Peterson et al. | |
| 5,315,072 A | * 5/1994 | Arai et al. .................. | 174/262 |
| 5,473,120 A | 12/1995 | Ito et al. | |
| 5,495,665 A | * 3/1996 | Carpenter et al. ............ | 29/830 |
| 5,509,200 A | * 4/1996 | Frankeny et al. ............. | 29/852 |
| 5,557,844 A | 9/1996 | Bhatt et al. | |
| 5,758,413 A | * 6/1998 | Chong et al. ................. | 29/852 |
| 5,979,044 A | * 11/1999 | Sumi et al. .................... | 29/830 |
| 6,214,445 B1 | 4/2001 | Kanabe et al. | |
| 6,265,671 B1 | 7/2001 | Matsuno | |
| 6,284,353 B1 | 9/2001 | Takada et al. | |
| 6,291,779 B1 | 9/2001 | Lubert et al. | |
| 6,373,717 B1 | 4/2002 | Downes et al. | |
| 6,411,519 B2 | 6/2002 | Asai et al. | |
| 6,581,280 B2 | * 6/2003 | Curcio et al. ................. | 29/832 |

FOREIGN PATENT DOCUMENTS

JP         10-284846         10/1998

* cited by examiner

Primary Examiner—Kamand Cuneo
Assistant Examiner—Jeremy Norris
(74) Attorney, Agent, or Firm—Birch, Stewart, Kolasch & Birch, LLP

(57) ABSTRACT

A multi-layer printed circuit board on which insulation resin layers and circuit pattern layers are alternatively stacked to form multiple layers, including: an insulation resin layer; a circuit pattern formed at the upper surface of the insulation resin layer; a blind via hole formed penetrating the insulation resin layer and the circuit pattern; a plated layer formed at the upper surface of the circuit pattern, at the inner wall face and the bottom of the blind via hole; an inner lead bump pad formed at the surface of the plated layer which is exposed to the lower surface of the insulation resin layer; and an outer lead bump pad formed on the circuit pattern which is formed at the upper surface of the insulation resin layer, whereby the problem of defective attachment of a bump due to a void present in a blind via hole is eliminated.

11 Claims, 12 Drawing Sheets

MULTI-LAYER PRINTED CIRCUIT BOARD AND A BGA SEMICONDUCTOR PACKAGE USING THE MULTI-LAYER PRINTED CIRCUIT BOARD

This application is a divisional of application Ser. No. 09/832,193, filed on Apr. 11, 2001 now U.S. Pat. No. 6,580,036, the entire contents of which are hereby incorporated by reference and for which priority is claimed under 35 U.S.C. § 120; and this application claims priority of Application No. 19037/2000 filed in Korea on Apr. 11, 2000 and Application No. 19040/2000 filed in Korea on Apr. 11, 2000 under 35 U.S.C. § 119.

BACKGROUND OF THE INVENTION

1. Field of the Invention

The present invention relates to a multi-layer printed circuit board, and more particularly, to a multi-layer printed circuit board having a plurality of bump connection pads for mounting a Ball Grid Array Packaging type semiconductor component, and its fabrication method. The present invention also relates to a printed circuit board having a thin printed circuit board compared to that of conventional art and which is capable of solving a problem of defective attachment of a bump due to a void in a blind via hole (referred to as 'BVH', hereinafter).

2. Description of the Background Art

FIG. 1 is a sectional view of a multi-layer printed circuit board in accordance with the conventional art.

As shown in the drawing, a plurality of resin layers 3a and 3b are stacked by a built-up method, and circuit patterns 5a, 5b and 5c made of metal thin layer are formed on each resin layer 3a and 3b.

A blind via hole 7b is formed penetrating the resin layer to connect the upper circuit pattern 5c and the lower circuit pattern 5a. The blind via hole 7b is formed having a reversed conical shape wherein the diameter of the entrance is greater than that of the bottom. The entrance of the upper via hole 7b and a lower via hole 7a is positioned in the same direction (the upward direction in FIG. 1).

Plated layers 9a and 9b are formed at the inner side of the blind via holes 7a and 7b, respectively. The plated layer 9a, 9b are also extendedly formed on the upper surface of the upper circuit pattern 5c and the lower circuit pattern 5a. Thus, the upper circuit pattern 5c and the lower circuit pattern 5a are electrically connected by the plated layers 9a, 9b.

An inner lead bump 11 for electrical connection with a semiconductor chip component (now shown) is attached at the upper portion of the plated layer 9b on the upper surface of the blind via hole 7b.

A solder resist layer 12 covers the upper surface of the plated layer 9b and the resin layer 3b except for the portions where the inner lead bump 11 is attached. That is, in the conventional multi-layer printed circuit board of FIG. 1, the inner lead bump 11 is attached in the blind via hole.

A method for fabricating the above described printed circuit board will now be explained.

First, a copper clad laminate (CCL) is prepared wherein an upper metal thin plate 4a and a lower metal thin plate 4b are coated on both surfaces of the lower resin layer 3a.

The upper metal thin plate 4a and the lower resin layer 3a are etched to form a lower blind via hole 7a. The lower plated layer 9a is formed at the side wall face and the bottom surface of the lower blind via hole 7a to electrically connect the upper and the lower metal thin plates 4a, 4b.

Thereafter, the upper metal thin plate 4a and the lower plated layer 9a are patterned to form the lower circuit pattern 5a.

Next, the resin layer 3b and a metal film 4c are formed at the upper surface of the lower plated layer 9a and the lower resin layer 3a.

And then, the metal film 4c and the upper resin layer 3b are partially etched to form the upper blind via hole 7b. At this time, the upper surface of the lower circuit pattern 5a is exposed through the upper blind via hole 7b.

And, the upper plated layer 9b is formed at the upper surface of the metal film 4c, at the inner wall face of the upper blind via hole 7b and at the upper surface of the lower plated layer 9a exposed at the bottom of the upper blind via hole 7b.

Then, the upper plated layer 9b and the metal film 4c are patterned. The patterned metal film 4c becomes the upper circuit pattern 5c. The upper circuit pattern 5c and the lower plated layer 9a are electrically connected by the upper plated layer 9b.

Next, the solder resist layer 12 is formed at the upper surface of the upper plated layer 9b and at the exposed upper resin layer 3b except for the inside of the upper blind via hole 7b. The upper surface of the upper plated layer 9b, which is exposed by not being covered with the solder resist layer 12, is a pad for attaching a bump for mounting a chip component.

And then, the solder bump 11 is attached at the upper surface of the upper plated layer 9b within the upper blind via hole 7b, that is, at the pad.

However, the printed circuit board fabricated according to the conventional method has the following problems.

For example, first, since the bump 11 is formed at the upper portion of the upper blind via hole 7b, the air in the upper blind via hole 7b is not discharged externally, forming an air void 14, or the air flows into the bump 11 and remains there. Then, due to the heat generated in mounting a chip component on the printed circuit board or from the intense heat generated from use of its product, the blind via hole or the air void of the bump swells to generate a crack to the printed circuit board around the bump or to deteriorate the attachment state of the chip components, resulting in damage to the packaging state of the chip components of the printed circuit board.

Secondly, in an effort to solve the problem, a Japanese Patent Laid Open No. 10-284846 discloses a method in which, for mounting the bump, the pad is extendedly designed in the vicinity of the blind via hole, avoiding the blind via hole. In this case, however, a problem arise in that the printed circuit board increases in size.

Thirdly, in a flip chip fabricating process, when an under filler is filled between the chip and the printed circuit board to correct a difference in the heat expansion between the chip mounted on the printed circuit board and the printed circuit board, the under filler is not completely filled in the blind via holes 7, causing a problem in that the printed circuit board is deformed due to thermal impact.

Lastly, in the case of forming a flexible printed circuit board, if the resin layer is too thin, it is inconvenient to handle it during the fabricating process, degrading yield rate. A solution to this problem is to forming the resin thick, but it is difficult to decrease the thickness of the printed circuit board.

SUMMARY OF THE INVENTION

Therefore, an object of the present invention is to provide an ultra-thin flexible printed circuit board.

Another object of the present invention is to provide a printed circuit board having a relatively fine circuit pattern which is formed at an outer layer thereof.

Still another object of the present invention is to provide a printed circuit board in which a solder bump and an inner lead, is formed at the opposite side of an opening of a blind via hole.

Yet another object of the present invention is to provide a printed circuit in which an opening of a blind via hole is directed to the center rather than to the outer surface thereof.

Still yet another object of the present invention is to provide a printed circuit board in which a circuit pattern to be formed at the upper surface thereof is thinner than a circuit pattern to be formed at the lower surface connected to a pain printed circuit board.

To achieve these and other advantages and in accordance with the purpose of the present invention, as embodied and broadly described herein, there is provided a multi-layer printed circuit board on which insulation resin layers and circuit pattern layers are alternatively stacked to form multiple layers, including: an insulation resin layer; a circuit pattern formed at the upper surface of the insulation resin layer; a blind via hole formed by penetrating the insulation resin layer and the circuit pattern; a plated layer formed at the upper surface of the circuit pattern, at the inner wall face and the bottom of the via hole; an inner lead bump pad formed at the surface of the plated layer which is exposed to the lower surface of the insulation resin layer; and an outer lead bump pad formed on the circuit pattern which is formed at the upper surface of the insulation resin layer.

To achieve the above objects, in the multi-layer printed circuit board of the present invention, a solder resist layer is filled in the blind via hole.

To achieve the above objects, in the multi-layer printed circuit board of the present invention, the inner lead bump pad is formed at the center of the blind via hole.

To achieve the above objects, there is provided a multi-layer printed circuit board including: a first substrate having a plurality of stacked resin layers, circuit patterns formed at the upper surface of each resin layer, blind via holes formed between the circuit patterns and plated layers formed at the inner wall face of the blind via holes and at the upper surface of the circuit patterns; and a second substrate having a plurality of stacked resin layers, circuit patterns formed at the upper surface of each resin layer, blind via holes formed between the circuit patterns and plated layers formed at the inner wall face of the blind via holes and at the upper surface of the circuit patterns, wherein the blind via hole of the first substrate and the blind via hole of the second substrate are disposed to face each other.

To achieve the above objects, in the multi-layer printed circuit board of the present invention, a core resin layer is formed between the first substrate and the second substrate for attaching the two substrates together.

To achieve the above objects, the multi-layer printed circuit board of the present invention further includes a through hole vertically penetrating the first substrate, the second substrate and the core resin layer. A substrate connecting plated layer is formed at the inner wall of the through hole.

To achieve the above objects, the first substrate of a multi-layer printed circuit board of the present invention includes: a first resin layer; a first circuit pattern formed at the upper surface of the first resin layer; a first blind via hole formed penetrating the first resin layer and the first circuit pattern; a first plated layer formed at the upper surface of the first circuit pattern and at the inner wall face and the bottom of the first blind via hole; a second resin layer formed at the upper surface of the first plated layer and the first resin layer; a second circuit pattern formed at the upper surface of the second resin layer; a second blind via hole formed penetrating the second circuit pattern and the second resin layer; a second plated layer formed at the upper surface of the second circuit pattern and at the inner wall face and the bottom of the second blind via hole; and a third circuit pattern formed at the surface of the first plated layer which is exposed to the first resin layer, wherein a core resin layer is filled in the second blind via hole.

To achieve the above objects, there is also provided a BGA semiconductor package including: a multi-layer printed circuit board having an insulation resin layer, circuit patterns formed at the upper surface of the insulation resin layer, a blind via hole formed penetrating the insulation resin layer and the circuit patterns, a plated layer formed at the upper surface of the circuit pattern and at the inner wall face and the bottom of the via hole, an inner lead bump pad formed at the surface of the plated layer exposed to the lower surface portion of the insulation resin layer, and an outer lead bump pad formed on the circuit pattern formed at the upper surface of the insulation resin layer; an inner lead bump attached on the surface of the inner lead bump pad; a semiconductor chip attached at the inner lead bump; and an outer lead bump attached on the surface of the outer lead bump pad.

To achieve the above objects, there is also provided a method for fabricating a multi-layer printed circuit board including the steps of: positioning a splitting member at one face of a core forming resin layer; stacking a first metal thin layer and a first insulation resin layer at one face of the splitting member and of the core forming resin layer; etching the first insulation resin layer to expose the first metal thin layer, to thereby form a first blind via hole; forming a first circuit pattern at the upper surface of the first insulation resin layer; forming a first plated layer at the upper surface of the first circuit pattern, at the inner wall face of the first blind via hole and at the upper surface of the first metal thin layer; sequentially stacking a second insulation resin layer and a second metal thin layer at the upper surface of the first insulation resin layer and of the first plated layer; etching the second insulation resin layer and the second metal thin layer to expose the upper surface of the first plated layer, to thereby form a second blind via hole; forming a second plated layer at the upper surface of the second metal thin layer and at the inner wall face and the bottom of the second blind via hole; patterning the second metal thin layer to form a second circuit pattern; separating the core forming resin layer and the splitting member from the first metal thin layer; and patterning the first metal thin layer to form an inner lead bumping pad.

To achieve the above objects, the method for fabricating a multi-layer printed circuit of the present invention further includes the steps of: forming an outer lead bumping pad at the upper surface of the second plated layer; attaching the outer lead bump at the upper surface of the outer lead bumping pad; and attaching the inner lead bump to the upper surface of the inner lead bumping pad.

To achieve the above objects, there is also provided a method for fabricating a multi-layer printed circuit board including the steps of: positioning a splitting member having a smaller size than the core forming resin layer on one face of the core forming resin layer, sequentially stacking the first thin metal plate having a greater size than the splitting member, the first insulation resin and the second thin metal plate on the splitting member, and attaching the core forming resin, the first insulation resin or the first thin metal plate; forming a blind via hole penetrating the first insulation resin layer and the second thin metal plate; forming a conductive layer at the first thin metal plate, the second thin metal plate and the inner wall face of the blind via hole to electrically connect the first thin metal plate and the second thin metal plate; patterning the second thin metal plate and the conductive layer to form a circuit pattern; removing the core forming resin layer and the splitting member; and patterning the first thin metal plate separated from the splitting member and forming inner lead bumping pads, at least one inner lead bumping pad being formed at the bottom of the blind via hole.

To achieve the above objects, the method for fabricating a multi-layer printed circuit board further includes the step of forming an outer lead bumping pad at the upper surface of the circuit pattern.

To achieve the above objects, the method for fabricating a multi-layer printed circuit board further includes the steps of forming an inner lead bump at the upper surface of the inner lead bumping pad; and forming an outer lead bump at the upper surface of the outer lead bumping pad.

To achieve the above objects, there is also provided a method for fabricating a multi-layer printed circuit board including the steps of: positioning a splitting member having a smaller size than the core forming resin layer on both faces of the core forming resin layer, sequentially stacking the first thin metal plate having a greater size than the splitting member, the first insulation resin and the second thin metal plate on the upper surface of each splitting member, and attaching the core forming resin, the first insulation resin or the first thin metal plate; forming a blind via hole by penetrating the first insulation resin layer and the second thin metal plate; forming a conductive layer at the first thin metal plate, the second thin metal plate and the inner wall face of the blind via hole to electrically connect the first thin metal plate and the second thin metal plate; patterning the second thin metal plate and the conductive layer to form a circuit pattern; removing the core forming resin layer and the splitting member to separate the structures formed at both faces of the core forming resin layer to divide into a first substrate and a second substrate; and patterning the first substrate and the first thin metal plate to form inner lead pumping pads, at least one inner lead bumping pad being formed at the bottom of the blind via hole.

To achieve the above objects, the method for fabricating a multi-layer printed circuit board of the present invention includes the steps of; disposing the openings of each blind via hole of the first and the second substrates to face each other, disposing a core resin between the first and the second substrates, and attaching the first and the second substrates; and patterning the first thin metal plate of the first substrate to form an inner lead bumping pad and patterning the first thin metal plate of the second substrate to form an outer lead bumping pad, after the step of dividing into the first and the second substrates.

To achieve the above objects, the method for fabricating a multi-layer printed circuit board further includes the steps of: forming a through hole penetrating the first substrate, the second substrate and the core forming resin; and forming a conductive layer at the inside of the through hole and at the upper surface of the inner lead bumping pad and of the outer lead bumping pad, before forming the inner lead bumping pad and the outer lead bumping pad.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A multi-layer printed circuit board in accordance with a first embodiment of the present invention will now be described with reference to FIG. 2.

A first resin layer 21*a* and a second resin layer 21*b* are formed stacked up and down. A first circuit pattern 22*a* is formed at the upper surface of the first resin layer 21*a*, and a first blind via hole 23*a* is formed penetrating the first resin layer 21*a*. The diameter of the entrance (the upper portion) of the first blind via hole 23*a* is greater than that of the bottom thereof, forming a reverse conical shape.

A first plated layer 24*a* is formed at the upper surface of the first circuit pattern 22*a* and at the inner wall face and bottom of the first blind via hole 23*a*. The lower surface of the first plated layer 24*a* formed at the bottom of the first blind via hole 23*a* is level with the lower surface of the first resin layer 21*a*.

A second circuit pattern 22*b* is formed at the upper surface of the second resin layer 21*b*, and a second blind via hole 23*b* is formed penetrating the second resin layer 21*b*. The second blind via hole 23*b* is formed on the first circuit pattern 22*a*, through which the first plated layer 24*a* formed at the upper surface of the first circuit pattern 22*a* is exposed.

A second plated layer 24*b* is formed at the upper surface of the second circuit pattern 22*b*, at the inner wall face of the second blind via hole 23*b* and at the upper surface of the first plated layer 24*a* exposed through the second blind via hole 23*b*.

A third circuit pattern 22c is formed at the lower surface of the first resin layer 21a.

An inner lead bumping pad 22d for attaching an inner lead bump is formed at the surface of the third circuit pattern 22c to electrically connect a semiconductor chip component and the printed circuit board 20.

This embodiment shows the stacking of two resin layers, i.e., the first and the second resin layers on the printed circuit board, but multi-layer resin layers of more than two may be stacked together to form a printed circuit board, depending on the desired use.

Figure 3:
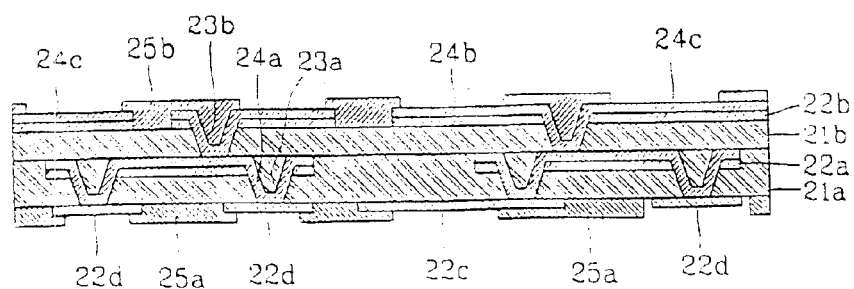
FIG. 3 is a sectional view of a substrate after forming a solder resist layer on the printed circuit board of FIG. 2 in accordance with the present invention.

In addition, as shown in FIG. 3, as for the printed circuit board 20 in accordance with the first embodiment of the present invention, in order to protect the circuit patterns of the printed circuit board, a solder resist layer may be formed thereon.

Figure 1:
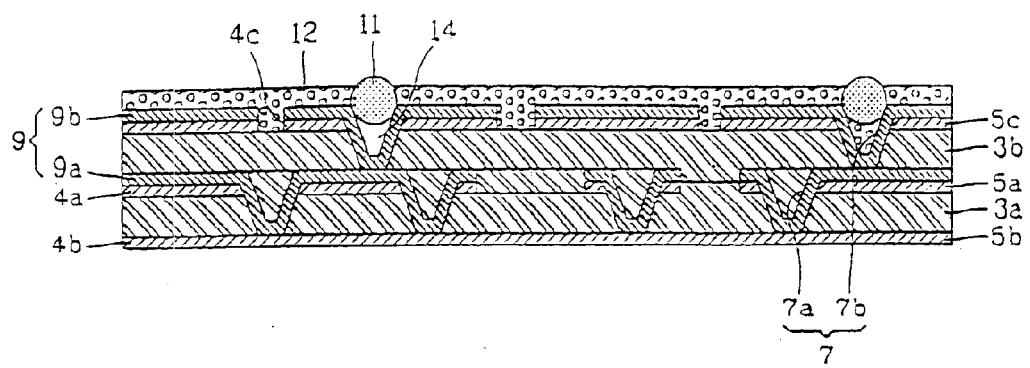
FIG. 1 is a sectional view of a printed circuit board in accordance with a conventional art.
Figure 2:
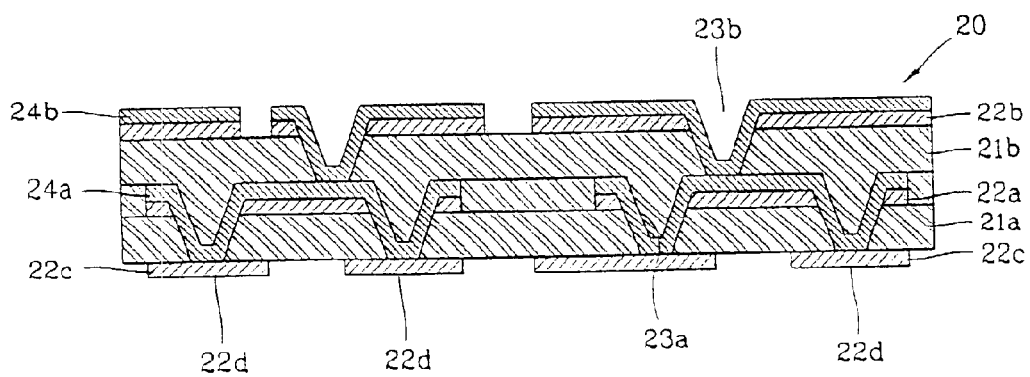
FIG. 2 is a sectional view of a printed circuit board in accordance with a first embodiment of the present invention.

The same elements in FIG. 3 as those of FIG. 2 are given the same reference numerals.

As shown in FIG. 3, a first solder resist layer 25a is partially formed at the lower surface of the first resin layer 21a and at the surface of the third circuit pattern 22c.

The exposed portion of the third circuit pattern 22c without being covered by the first solder resist layer 25a is the inner lead bumping pad 22d for attaching the inner lead bump to electrically connect a chip component and a printed circuit board 20.

A second solder resist layer 25b is formed at the upper surface of the second resin layer 21b and at the upper surface of the second plated layer 24b formed at the inner side of the second blind via hole 23b.

The exposed portion of the second plated layer 24b, without being covered by the second solder resist layer 25b, is an outer lead bumping pad 24c for attaching an outer lead bump to electrically connect the main PCB and the printed circuit board 20.

The second blind via hole 23b is completely filled with the second solder resist layer 25b.

Figure 4:
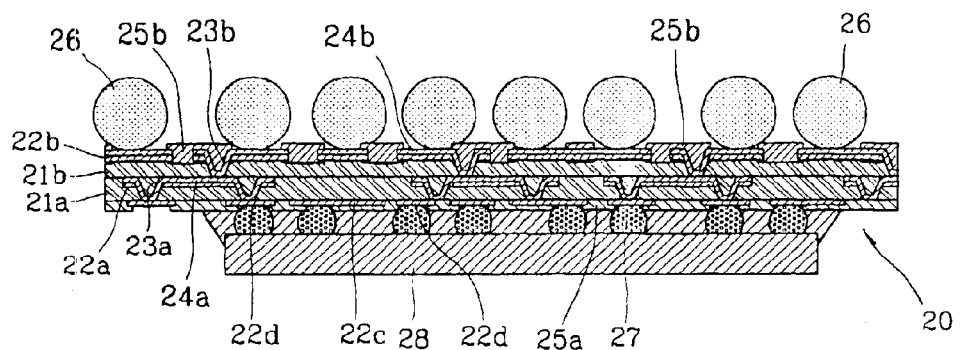
FIG. 4 is a sectional view of the substrate after forming solder bumps on the substrate of FIG. 3.

FIG. 4 is a sectional view of the substrate after forming solder bumps on the substrate of FIG. 3.

As shown in the drawing, an inner lead bump 27 is to be connected with a chip component 28, and an outer lead bump 20 is to be connected with the main PCB (that is, the main PCB of an electronic appliance).

In other words, the inner lead bump 27 is formed at the upper surface of the inner lead bumping pad 22d of the third circuit pattern 22c formed in the opposite face of the opening of the blind via hole, and a ball grid array (BGA) semiconductor chip 28 is attached on the upper surface of the inner lead bump 27.

The outer lead bump 26 is attached at the upper surface of the outer lead bumping pad 24c at the surface where the opening of the blind via hole 23b of the printed circuit board is formed.

The outer lead bumping pad 24c is bigger than the inner lead bumping pad 22d, and the outer lead bump 26 is formed larger than the inner lead bump 27. The reason for this is that, as the chip component 28 connected with the inner lead bump 27, that is, the semiconductor device, is being integrated with a higher density, the size of the inner lead bump remains the same or is rather reduced. But, in this respect, since the external terminals of the semiconductor chip components rather increases in number, the space between the terminals becomes narrow. Thus, the inner lead bumping pad 22d of the printed circuit board needs to become small, whereas the main PCB, relatively speaking, is not varied in its size.

Figure 5:
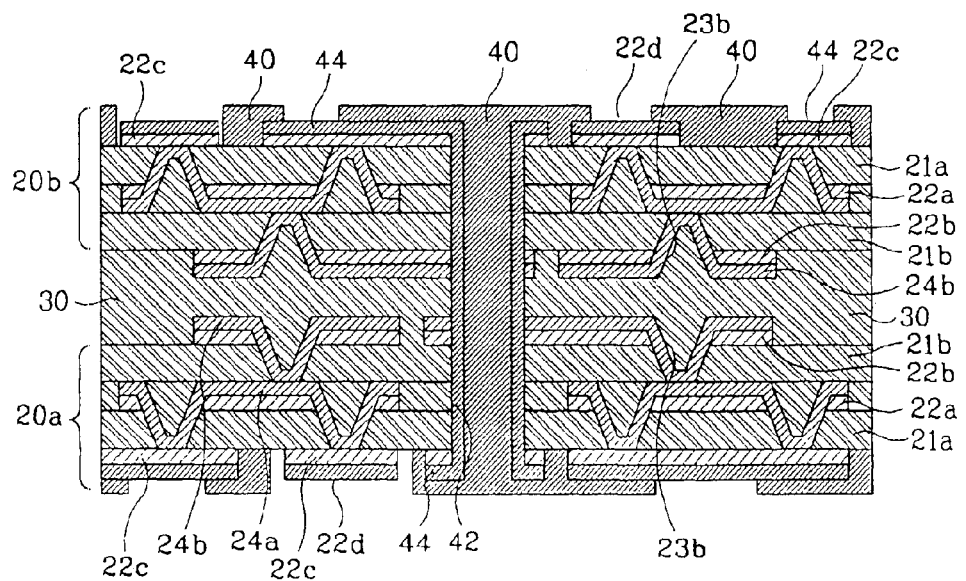
FIG. 5 is a sectional view of a printed circuit board in accordance with a second embodiment of the present invention.

FIG. 5 is a sectional view of a printed circuit board in accordance with a second embodiment of the present invention.

The printed circuit board in accordance with the second embodiment of the present invention is formed by providing a core resin layer 30 at the center and attaching, in a facing manner, two printed circuit boards of the first embodiment at the upper and a lower surfaces of the core resin layer 30.

The reference numerals which are the same as those of FIG. 2 indicate the same elements, and thus the descriptions thereof can be omitted.

In FIG. 5, for explanation's sake, the printed circuit board attached at the lower side of the core resin layer 30 is called a first substrate 20a, while the printed circuit board attached at the upper side of the core resin layer 30 is call a second substrate 20b.

That is, the first substrate 20a and the second substrate 20b are attached to the core resin layer 30 in a manner such that the openings of the second blind via holes 23b face each other, directing the core resin layer.

The second blind via holes 23b are filled with core resin layer. That is, since the blind via hole 23b is not exposed to the surface of the printed circuit board, a deficiency due to the formation of a void in the blind via hole as in the conventional art does not occur.

A third circuit pattern 22c is formed at the outer surface of the first substrate 20a and the second substrate 20b, and a solder resist layer 40 is formed at a part of the upper surface of the third circuit patterns 22c and at the surface of the first resin layer 21a, serving to insulate the third circuit patterns 22c.

In order to electrically connect the first substrate 20a and the second substrate 20b, a through hole 42 is formed penetrating the first substrate 20a, the second substrate 20b and the core resin layer 30.

A plated layer 44 for connecting the substrates is formed at the inner wall face of the through hole 42. The substrate connecting the plated layer 44 is extended to the upper surface of the third circuit pattern 22c formed at the surface of the first substrate 20a and to the upper surface of the circuit pattern 22c formed at the surface of the second substrate 20b, by which the first substrate 20a and the second substrate 20b are electrically connected. The through hole is filled with a solder resist layer 40.

A method for fabricating the printed circuit board of the present invention will now be described.

The printed circuit board in accordance with the first embodiment of the present invention is fabricated as follows.

Figure 6A:
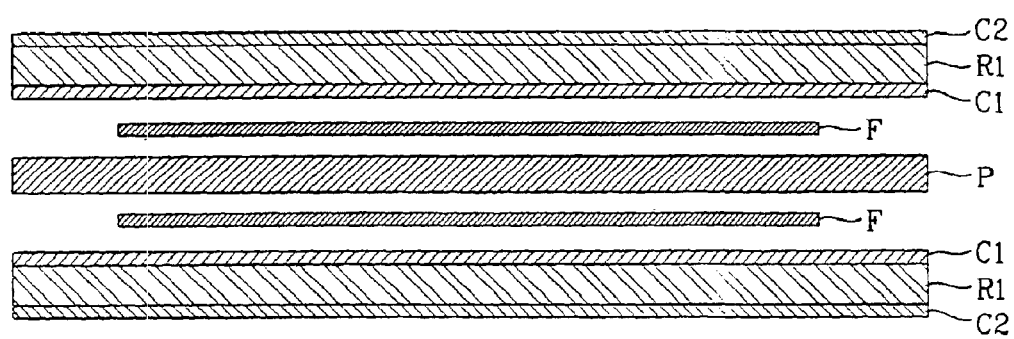
FIGS. 6A through 6M are sectional view showing the sequential processes for fabrication the printed circuit board in accordance with the first embodiment of the present invention.

With reference to FIG. 6A, a splitting film 'F' is positioned at the upper and the lower surfaces of a core forming prepreg 'P'. The prepreg 'P' is platy, and the splitting film is smaller than the prepreg 'P'.

CCLs (Copper Clad Laminate) 60a and 60b with both of its surfaces coated with copper are positioned at the upper and lower surfaces of the splitting film 'F'. The CCLs 60a and 60b include a first resin layer 'R1' and a first and a second copper thin plate C1 and C2 coated on the first resin layer 'R1'.

Reference numeral 60a is the CCL formed at the upper surface of the prepreg 'P' and reference numeral 60b is the CCL formed at the lower surface of the prepreg 'P'.

Figure 6B:
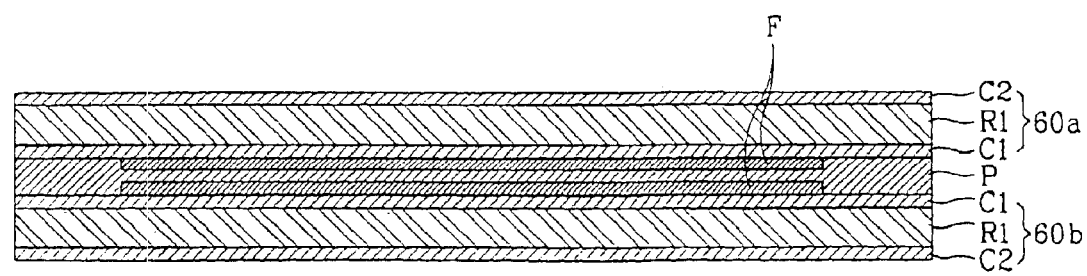

Next, after arranging the elements of FIG. 6A, when the arranged elements are heated and pressure d, the core forming prepreg 'P' is melted and attached to the upper and the lower CCLs 60a and 60b, forming one panel as shown in FIG. 6B.

At this time, the CCLs 60a and 60b are not attached at the portion where the splitting film 'F' is attached, and are attached at the marginal portion where the splitting film is not attached.

After the heat treatment, the prepreg 'P' is hardened to make it easy to handle the panel in the following process for the printed circuit board.

Figure 6C:
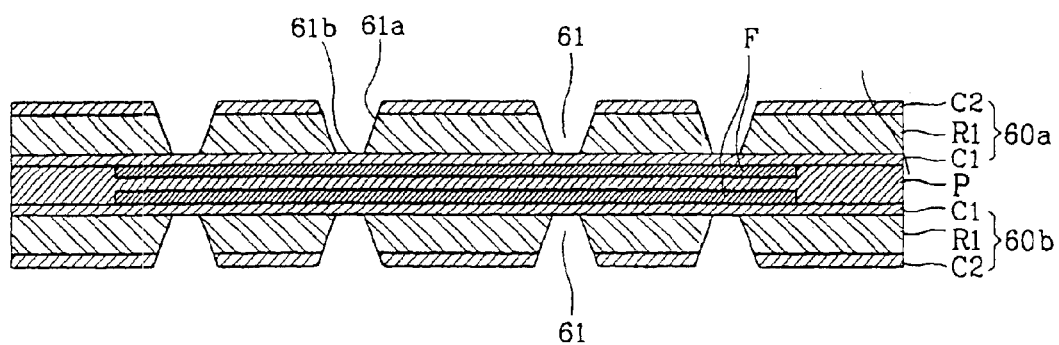

Next, as shown in FIG. 6C, a first blind via hole 61 is formed penetrating the second copper thin plate C2 and the first resin layer R1 of each of the upper and lower CCLs 60a and 60b of the prepreg 'P'. The first blind via hole 61 is drilled by a laser. In this respect, if a laser is used which is incapable of processing copper, the second copper thin plate C2 is etched and removed to form a window and the first resin layer R1 is removed through laser processing. The reason why the side face of the first blind via hole 61 is slanted is to make a smooth coating in a subsequent plating process. The upper CCL 60a and the lower CCL 60b of the prepreg 'P' are positioned to correspond to each other.

Figure 6D:
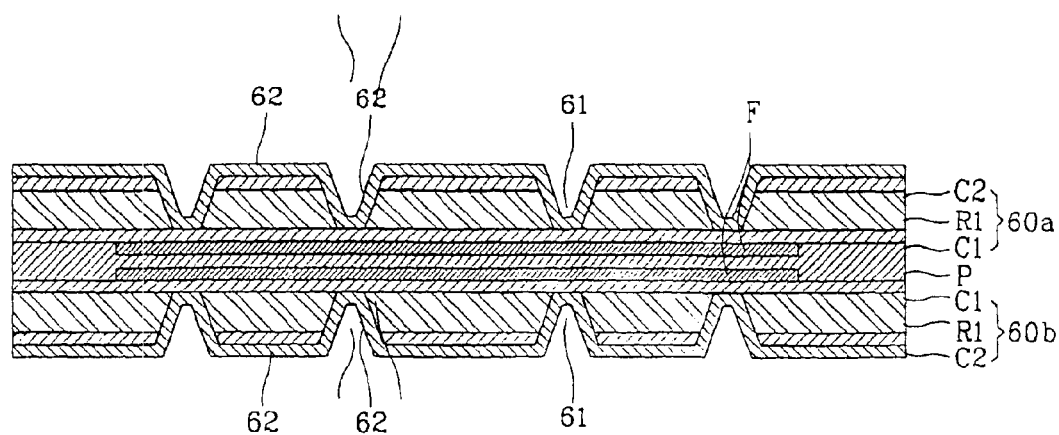

Next, with reference to FIG. 6D, the first plated layer 62 is formed at the inner side face 61a of the first blind via hole 61, at the bottom 61b, that is, the upper surface of the first copper thin plate C1 and at the surface of the second copper thin plate C2. The first copper thin plate C1 and the second copper thin plate C2 are electrically conducted by the first plated layer 62.

Figure 6E:
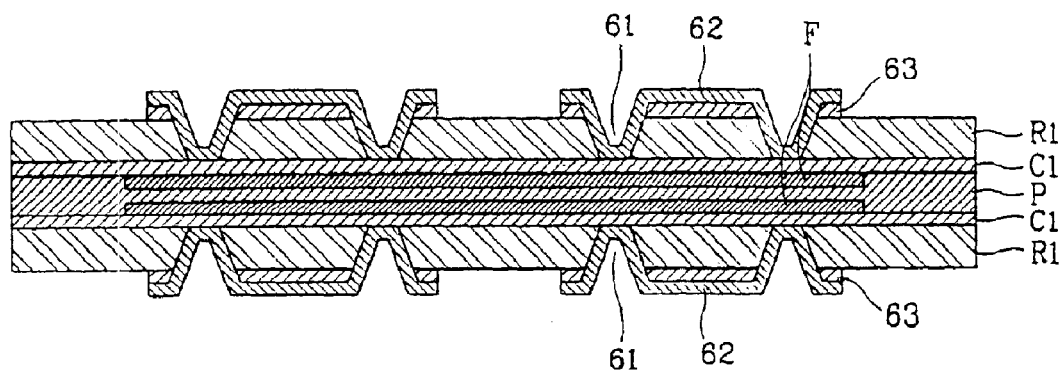

With reference to FIG. 6E, the first plated layer 62 and the second copper thin plate C2 are patterned in the same manner by using a typical etching method to form a first circuit pattern 63. The portions where the first plated layer 62 and the second copper thin plate C2 are removed, expose the first resin layer R1.

Figure 6F:
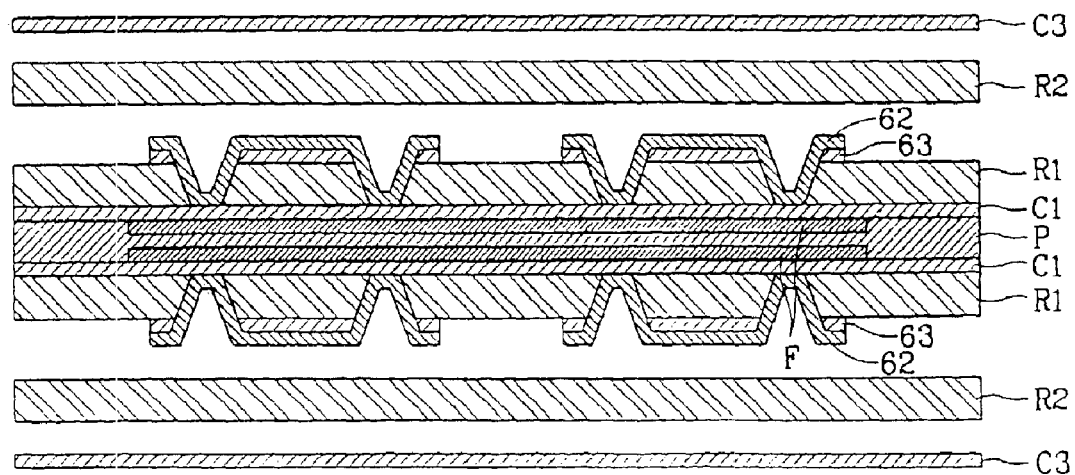

With reference to FIG. 6F, the second resin layer R2 and a third copper thin plate C3 are mounted and stacked at the upper surface of the first circuit pattern 63 and the first resin layer R1. At this time, a second resin layer R2 and the third copper thin plate C3 may be stacked separatedly, or the Resin Coated Copper Foil (RCC) where the third copper thin plate C3 is coated on the second resin layer R2, can be also used.

Figure 6G:
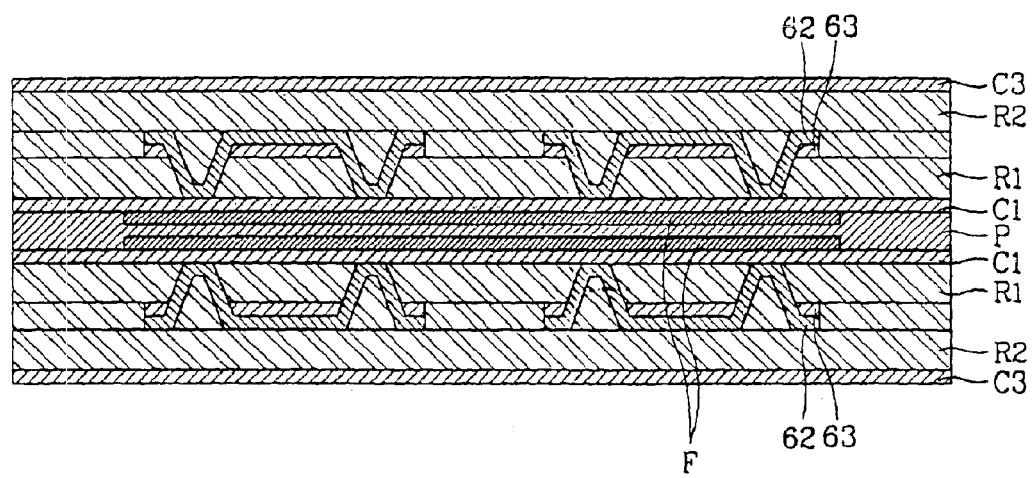

The structure of FIG. 6F is heated and pressured so that, as shown in FIG. 6G, the second resin layer R2 and the third copper thin plate C3 are attached to the panel having the first resin layer R1 and the first circuit pattern 63, and the first resin layer R1 and the second resin R2 are melted to each other and integrated.

Figure 6H:
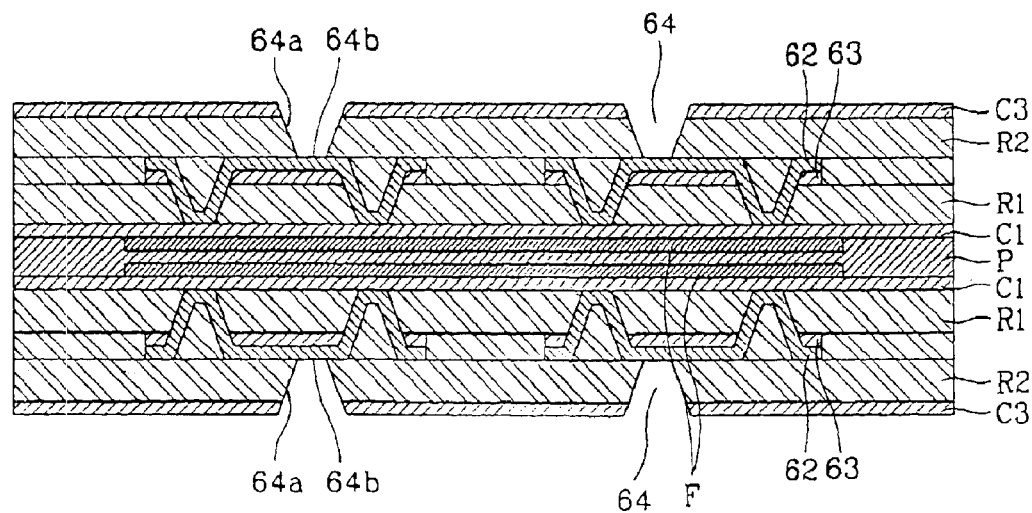

With reference to FIG. 6H, a second blind via hole 64 is formed at the third copper thin plate C3 and at the second resin layer R2, using a laser. The second blind via hole 64 also has a slanted side wall 64a, and the upper surface of the first plated layer 62 is exposed at a bottom 64b of the second blind via hole 64.

Figure 6I:
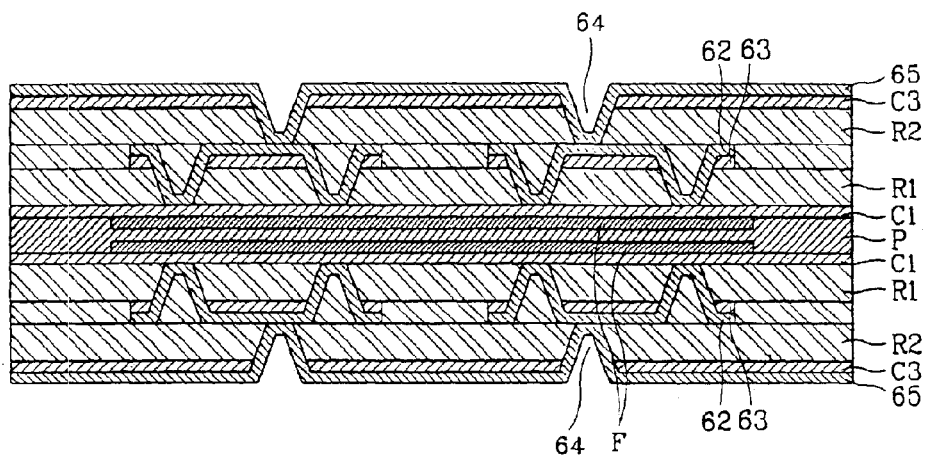

With reference to FIG. 6I, a second plated layer 65 is formed wholly at the side wall 64a and at the bottom 64b of the second blind via hole 64 and at the upper surface of the third copper thin plate C3.

Figure 6J:
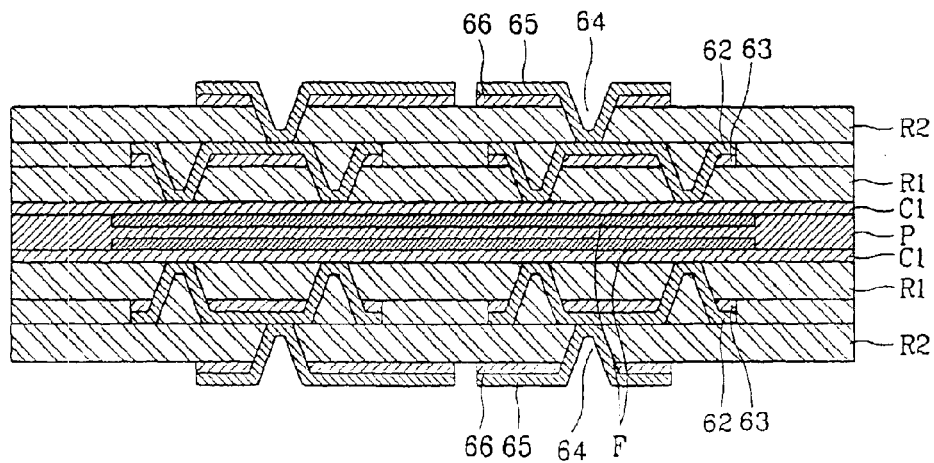

With reference to FIG. 6J, the third copper thin plate C3 and the second plated layer 65 are patterned to form a second circuit pattern 66.

In the above descriptions, the same processes are simultaneously performed at the upper and the lower surfaces of the prepreg 'P'. However, a method is also available in which the fabrication process is performed at one surface of the prepreg 'P' and then the same fabrication process is sequentially performed at the other surface thereof.

Figure 6K:
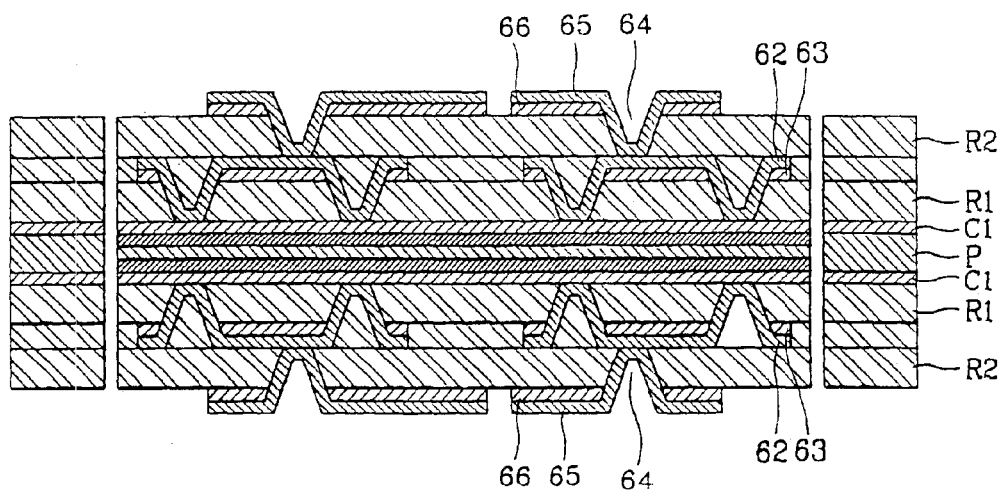

With reference to FIG. 6K, both marginal portions of the panel of FIG. 6J is cut out. That is, the panel is cut out along the margin of the splitting film 'F'.

Figure 6L:
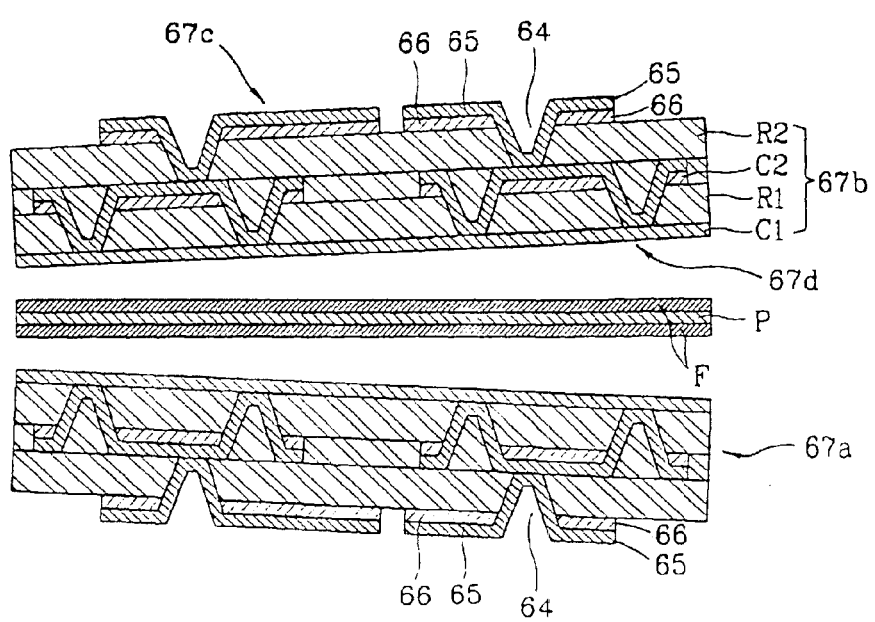

With reference to FIG. 6L, when the upper and the lower substrate are separated from the splitting film 'F' and the prepreg 'P', two sheets of printed circuit boards are simultaneously formed.

For explanation's sake, the lower substrate of the prepreg 'P' is called a first substrate 67a, and the upper substrate is called a second substrate 67b. And, in the first substrate 67a and the second substrate 67b, the surface where the blind via hole 64 is formed is regarded as an upper surface 67c and the lower surface contacting the splitting film 'F' is considered a lower surface 67d.

Figure 6M:
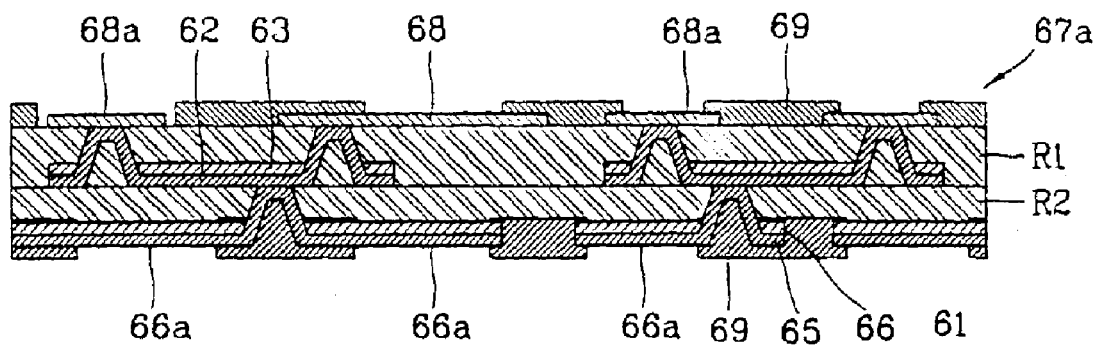

With reference to FIG. 6M, The first copper thin plate C1 of the lower surface 67c of one of the first substrate 67a and the second substrate 67b is patterned to form a third circuit pattern 68.

At this time, when the third circuit pattern 68 is formed at the outer surface of the first substrate 67a or the second substrate 67b, since no plated layer is formed, only the first copper thin plate C1 needs to be etched according to its thickness. Thus, the copper thin plate to be removed in the etching process is thin, and a fine circuit pattern can be formed.

Next, a solder resist layer 69 is formed at a part of the upper surface of the third circuit pattern 68 and at a part of the upper surface of the second plated layer 65 positioned at the upper surface of the second circuit pattern 66 by using a conventional method.

The exposed portion of the third circuit pattern 68 becomes an inner lead bumping pad 68a, and the exposed portion of the second plated layer 65 becomes an outer lead bumping pad 66a. Accordingly, the inner lead bumping pad 68a is possibly positioned in the roughly direct upper direction of the first blind via hole 61 of the substrates 67a and 67b.

Though not shown in the Figures, the outer lead bump is attached to the outer lead bumping pad 66a positioned at the upper surface of the second circuit pattern 66, so as to connect the printed circuit board to the main PCB, and the inner lead bump is attached to the inner lead bumping pad 68a positioned at the upper surface of the third circuit pattern 68, so as to be connected with the chip component.

A method for fabricating a printed circuit board in accordance with the second embodiment of FIG. 2 of the present invention will now be described.

Figure 7A:
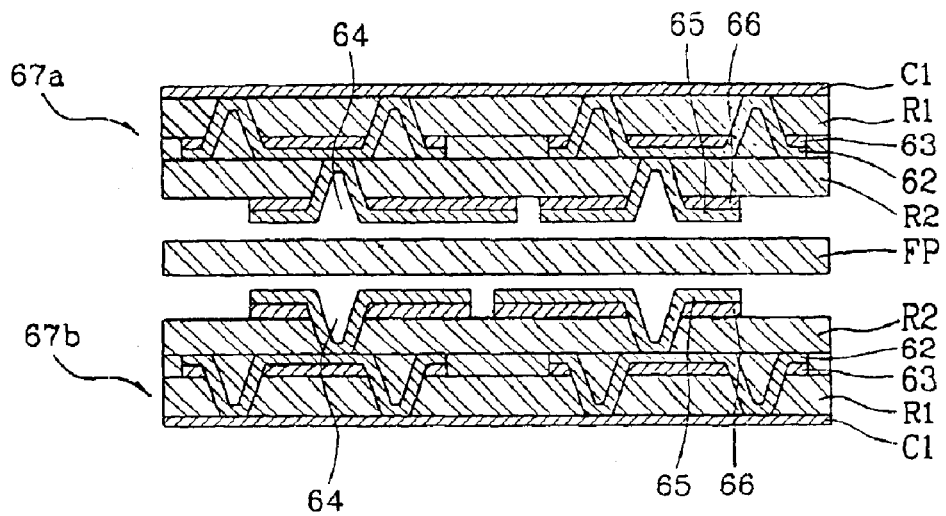
FIGS. 7A through 7F are sectional view showing the sequential processes for fabrication the printed circuit board in accordance with the second embodiment of the present invention.

With reference to FIG. 7A, the first and the second substrates 67a and 67b fabricated through the sequential processes of FIGS. 6A through 6L are prepared. In this respect, the first and the second substrates may not be formed in the same shape. Also, the first substrate 67a may be first fabricated, and the second substrate 67b may be formed in a different structure.

The opening of the blind via hole 64 of the first substrate 67a and the blind via hole 64 of the second substrate 67b face each other. A flexible preg FP is positioned between the first substrate 67a and the second substrate 67b.

Figure 7B:
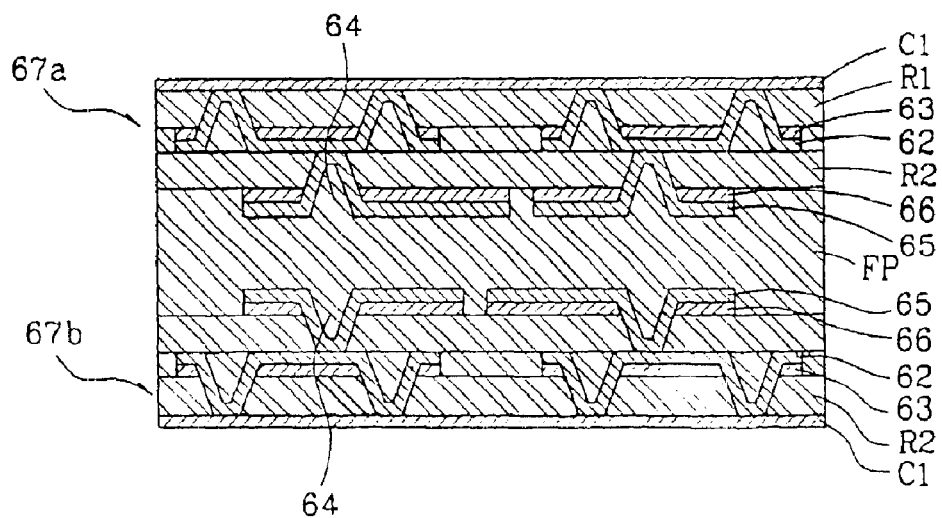

Next, the structure of FIG. 7A is heated and pressed to attach the first substrate 67a and the second substrate 67b to the flexible preg FP, thereby fabricating an integrated panel as shown in FIG. 7B. The flexible preg FP of FIG. 7A is the core resin layer of FIG. 7B.

Figure 7C:
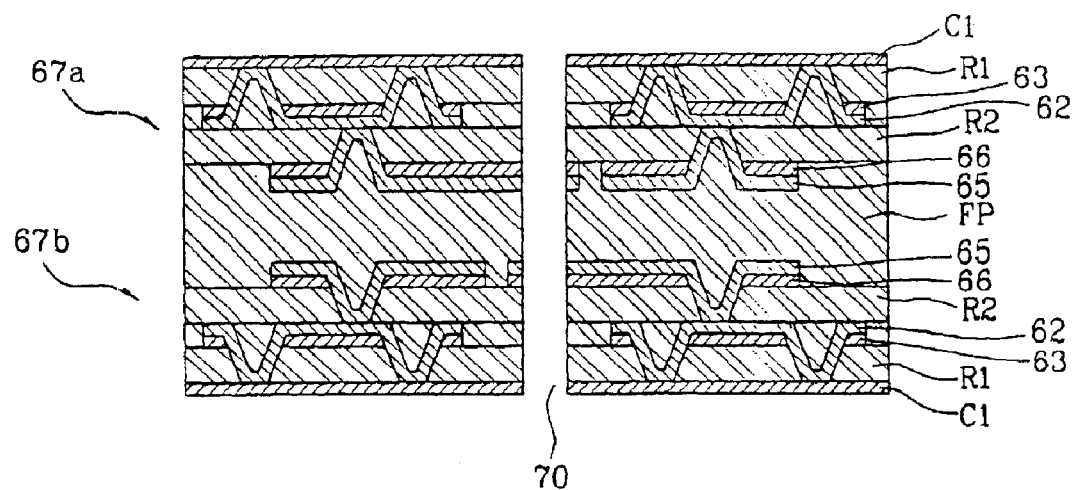

With reference to FIG. 7C, a through hole 70 is formed penetrating the first substrate 67a, the second substrate 67b and the core resin layer FP.

Figure 7D:
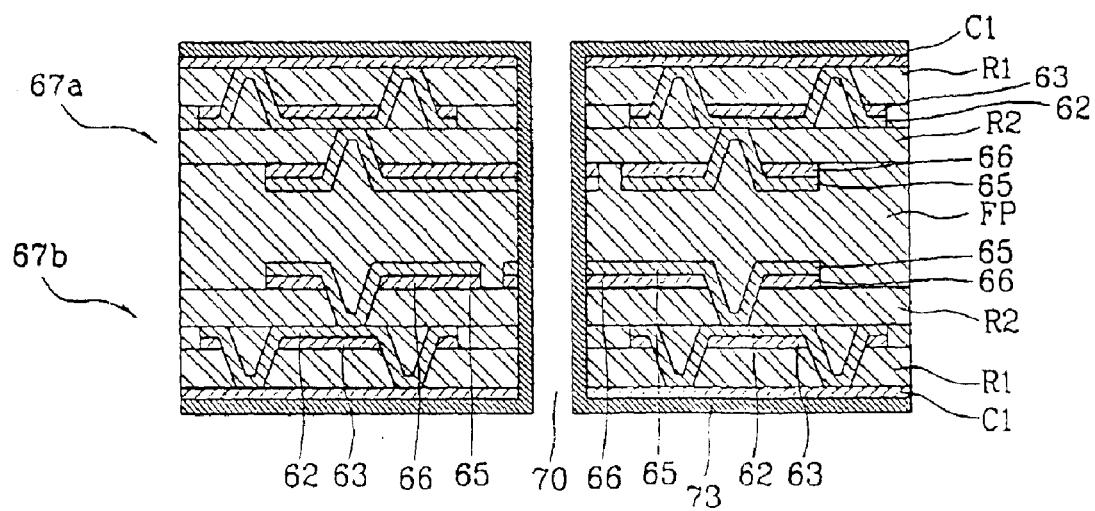

With reference to FIG. 7D, a plated layer 73 for connecting substrates is formed at the wall face of the through hole 70 and at the outer surface layer of the first and the second substrates 67a and 67b. The substrate-connecting plated layer 73 formed along the inner wall face of the through hole 70 electrically connects the first substrate 67a and the second substrate 67b.

Figure 7E:
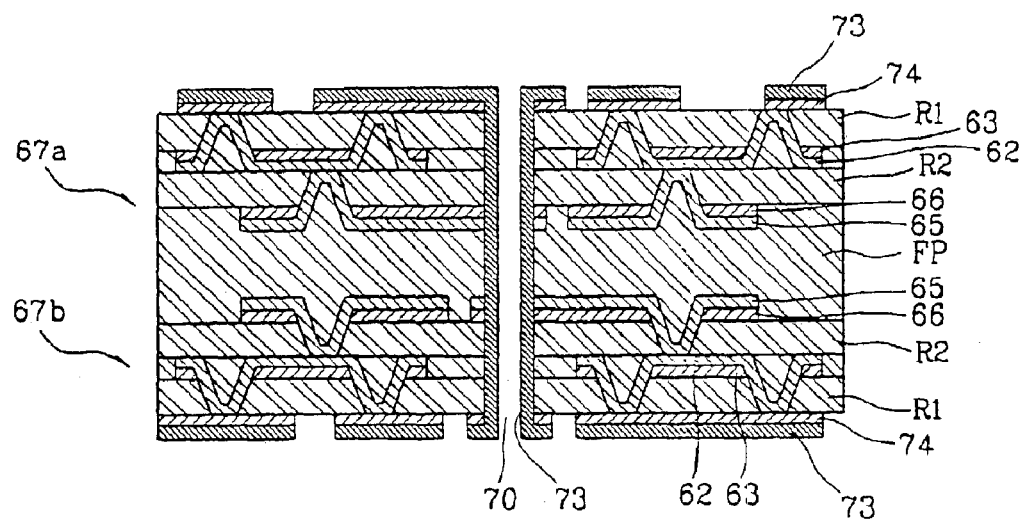

With reference to FIG. 7E, the substrate-connecting plated layer 73 and the first copper thin plate C1 are subject to photography, development and etching for patterning, thereby forming a circuit pattern 74.

Figure 7F:
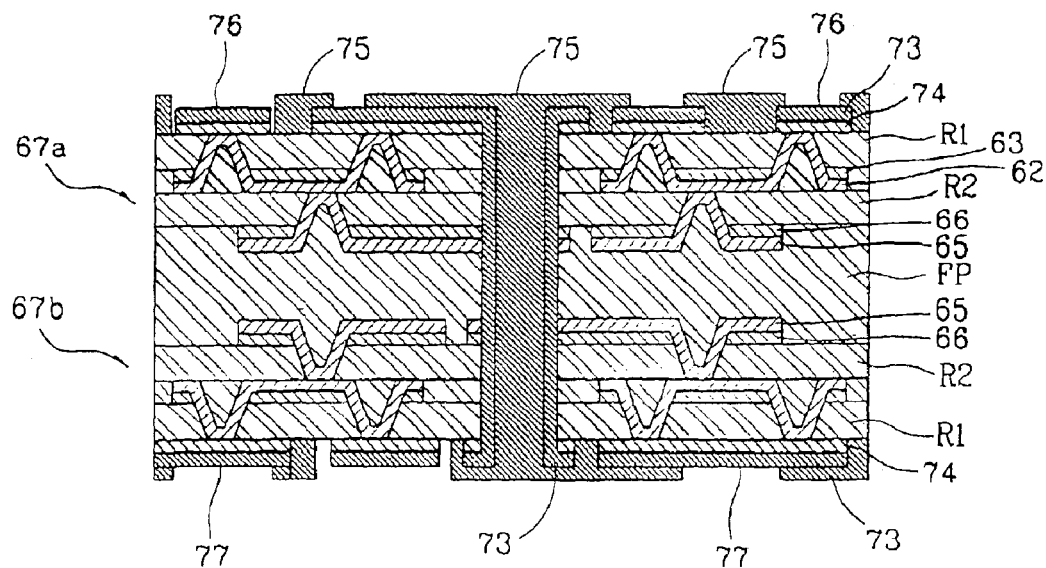

With reference to FIG. 7F, a solder resist layer 75 is formed at a part of the upper surface of the circuit pattern 74 and at the upper surface of the first resin layer R1, and at the same time, the through hole 70 is filled with the solder resist layer 75, so that the printed circuit board is completely fabricated according to the second embodiment.

The exposed portion of the substrate-connecting plated layer 73 without being covered by the solder resist layer 75 is the outer lead bumping pad and the inner lead bumping pad of the printed circuit board.

After the solder resist layer 75 is formed, the inner lead bumping pad 76 is formed at the upper surface of the substrate-connecting plated layer 73 of the first substrate 67a, and the outer lead bumping pad 77 is formed at the upper surface of the substrate-connecting plated layer 73 of the second substrate 67b.

Accordingly, the inner lead bumping pad 76 and the outer lead bumping pad 77 are possibly positioned in roughly the direct upper direction of the blind via hole in the substrates 67a and 67b.

As so far described, the method for fabricating a multi-layer printed circuit board according to the present invention has many advantages.

For example, since the printed circuit board is fabricated by taking the prepreg 'P' as a support plate, even through the resin layer has the thickness of less than 100 $\mu$m, it can be easily handled. Also, since the resin layer is thin, the over all thickness of the printed circuit board is also thin.

In addition, the openings of the blind via holes are all directed to the core resin layers. That is, they are not exposed to the outer surface of the printed circuit board. Therefore, the problem of deterioration of the bump attachment state due to a void forming in the blind via hole while mounting components, can be eliminated.

Lastly, when the pad is formed to be attached to the inner lead bump, the thin copper plate is just etched, so that a fine circuit pattern can be formed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A multi-layer printed circuit board comprising:
   a first substrate having a plurality of stacked resin layers, circuit patterns formed at the upper surface of each resin layer, blind via holes formed between the circuit patterns and plated layers formed at the inner wall face of the blind via holes and at the upper surface of the circuit patterns; and
   a second substrate having a plurality of stacked resin layers, circuit patterns formed at the upper surface of each resin layer, blind via holes formed between the circuit patterns and plated layers formed at the inner wall face of the blind via holes and at the upper surface of the circuit patterns,
   wherein the blind via hole of the first substrate and the blind via hole of the second substrate are disposed to face each other, and wherein the first substrate comprises:
   a first resin layer;
   a first circuit pattern formed at the upper surface of the first resin layer;
   a first blind via hole formed to penetrate the first resin layer and the first circuit pattern;
   a first plated layer formed at the upper surface of the first circuit pattern and at the inner wall and the bottom of the first blind via hole;
   a second resin layer formed at the upper surface of the first plated layer and the first resin layer;
   a second circuit pattern formed at the upper surface of the second resin layer;
   a second blind via hole formed to penetrate the second circuit pattern and the second resin layer;
   a second plated layer formed at the upper surface of the second circuit pattern and at the inner wall face and the bottom of the second blind via hole; and
   a third circuit pattern formed at the surface of the first plated layer which is exposed to the first resin layer,
   wherein a core resin layer is contained in the second blind via hole.

2. The multi-layer printed circuit board of claim 1, wherein a core resin layer is formed between the first substrate and the second substrate to attach the two substrates together.

3. The multi-layer printed circuit board of claim 2, further comprising:
   a through hole substantially vertically penetrating the first substrate, the second substrate and the core resin layer; and
   a substrate-connecting plated layer formed at the inner wall of the through hole.

4. A method for fabricating a multi-layer printed circuit board comprising the steps of:
   positioning a splitting member at one face of a core forming resin layer;
   stacking a thin first metal layer and a first insulation resin layer at one face of the splitting member and the core forming resin layer;
   etching the first insulation resin layer to expose the first metal thin layer, to thereby form a first blind via hole;
   forming a first circuit pattern at the upper surface of the first insulation resin layer;
   forming a first plated layer at the upper surface of the first circuit pattern, at the inner wall face of the first blind via hole and at the upper surface of the first thin metal layer;
   sequentially stacking a second insulation resin layer and a second thin metal layer at the upper surface of the first insulation resin layer and the first plated layer;
   etching the second insulation resin layer and the second thin metal layer to expose the upper surface of the first plated layer, to thereby form a second blind via hole;

forming a second plated layer at the upper surface of the second thin metal layer and at the inner wall face and the bottom of the second blind via hole;

patterning the second thin metal layer to form a second circuit pattern;

separating the core forming resin layer and the splitting member from the first thin metal layer; and patterning the first thin metal layer to form an inner lead bumping pad.

5. The method of claim 4, further comprising the steps of:

forming an outer lead bumping pad at the upper surface of the second plated layer;

attaching the outer lead bump at the upper surface of the outer lead bumping pad; and attaching the inner lead bump to the upper surface of the inner lead bumping pad.

6. A method for fabricating a multi-layer printed circuit board comprising the steps of:

positioning a splitting member having a smaller size than a core forming resin layer on one face of the core forming resin layer, sequentially stacking the first thin metal plate having a larger size than the splitting member, the first insulation resin and the second thin metal plate on the splitting member, and attaching the core forming resin, the first insulation resin or the first thin metal plate;

forming a blind via hole which penetrates the first insulation resin layer and the second thin metal plate;

forming a conductive layer at the first thin metal plate, the second thin metal plate and the inner wall face of the blind via hole to electrically connect the first thin metal plate and the second thin metal plate;

patterning the second thin metal plate and the conductive layer to form a circuit pattern; removing the core forming resin layer and the splitting member; and patterning the first thin metal plate separated from the splitting member and forming inner lead bumping pads, at least one inner lead bumping pad being formed at the bottom of the blind via hole.

7. The method of claim 6, further comprising the step of forming an outer lead bumping pad at the upper surface of the circuit pattern.

8. The method of claim 7, further comprising the steps of:

forming an inner lead bump at the upper surface of the inner lead bumping pad; and forming an outer lead bump at the upper surface of the outer lead bumping pad.

9. A method for fabricating a multi-layer printed circuit board comprising the steps of:

positioning a splitting member having a smaller size than the core forming resin layer on both faces of a core forming resin layer, sequentially stacking the first thin metal plate having a larger size than the splitting member, the first insulation resin and the second thin metal plate on the upper surface of each splitting member, and attaching the core forming resin, the first insulation resin or the first thin metal plate;

forming a blind via hole penetrating the first insulation resin layer and the second thin metal plate;

forming a conductive layer at the first thin metal plate, the second thin metal plate and the inner wall face of the blind via hole to electrically connect the first thin metal plate and the second thin metal plate;

patterning the second thin metal plate and the conductive layer to form a circuit pattern;

removing the core forming resin layer and the splitting member to separate the structures formed at both faces of the core forming resin layer to form a first substrate and a second substrate; and patterning the first substrate and the first thin metal plate to form inner lead pumping pads, at least one inner lead bumping pad being formed at the bottom of the blind via hole.

10. The method of claim 9, wherein after the step of dividing into the first and the second substrates, further comprising the steps of:

disposing the openings of each blind via hole of the first and the second substrates to face each other, disposing a core resin between the first and the second substrates, and attaching the first and the second substrates together; and patterning the first thin metal plate of the first substrate to form an inner lead bumping pad and patterning the first thin metal plate of the second substrate to form an outer lead bumping pad.

11. The method of claim 10, wherein before forming the inner lead bumping pad and the outer lead bumping pad, further comprising the steps of:

forming a through hole penetrating the first substrate, the second substrate and the core forming resin; and forming a conductive layer at the inside of the through hole and at the upper surface of the inner lead bumping pad and the outer lead bumping pad.

* * * * *